(12) United States Patent
Lee et al.

(10) Patent No.: US 6,890,841 B2
(45) Date of Patent: May 10, 2005

(54) METHODS OF FORMING INTEGRATED CIRCUIT MEMORY DEVICES THAT INCLUDE A PLURALITY OF LANDING PAD HOLES THAT ARE ARRANGED IN A STAGGERED PATTERN AND INTEGRATED CIRCUIT MEMORY DEVICES FORMED THEREBY

(75) Inventors: Kyu-hyun Lee, Kyungki-do (KR); Tae-young Chung, Yongin (KR); Chang-hyun Cho, Yongin (KR); Yang-keun Park, Yongin (KR); Sang-bum Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 10/442,481

(22) Filed: May 21, 2003

(65) Prior Publication Data

US 2003/0235946 A1 Dec. 25, 2003

(30) Foreign Application Priority Data

Jun. 21, 2002 (KR) .................. 10-2002-0034996

(51) Int. Cl.$^7$ ............... H01L 21/20; H01L 21/8242; H01L 29/94
(52) U.S. Cl. .............. 438/487; 438/253; 438/254; 438/396; 438/397; 257/306; 257/303; 257/734; 257/908
(58) Field of Search .................. 438/487, 253, 438/254, 396, 397, 701; 257/306, 303, 296, 734, 908, 311

(56) References Cited

U.S. PATENT DOCUMENTS

| | | | | |
|---|---|---|---|---|
| 5,622,883 A | * | 4/1997 | Kim ........................... | 438/396 |
| 6,153,516 A | * | 11/2000 | Chien ......................... | 438/647 |
| 6,249,018 B1 | * | 6/2001 | Liaw et al. ................. | 257/303 |
| 6,329,241 B1 | * | 12/2001 | Lin ............................. | 438/253 |
| 6,406,971 B1 | * | 6/2002 | Chien et al. ................ | 438/398 |
| 6,521,933 B2 | * | 2/2003 | Miyajima et al. .......... | 257/296 |

FOREIGN PATENT DOCUMENTS

| JP | 14-083881 | 3/2002 |
|---|---|---|
| KR | 2002-34468 A | 5/2002 |

* cited by examiner

Primary Examiner—Carldad Everhart
Assistant Examiner—Igwe U. Anya
(74) Attorney, Agent, or Firm—Myers Bigel Sibley & Sajovec

(57) ABSTRACT

An integrated circuit memory device is formed by forming an interlevel insulating layer on a substrate. A plurality of storage node contact holes are formed in the interlayer insulating layer and are arranged in a pattern. A plurality of contact plugs are formed in the plurality of storage node contact holes, respectively. A material layer is formed on the interlevel insulating layer that has a plurality of landing pad holes that expose the plurality of contact plugs, respectively, the plurality of landing pad holes are arranged in a pattern that is offset with respect to the pattern of the storage node contact holes. A plurality of landing pads are formed in the plurality of landing pad holes and are connected to the plurality of contact plugs, respectively. A plurality of storage nodes are formed that are connected to the plurality of landing pads, respectively.

24 Claims, 6 Drawing Sheets

METHODS OF FORMING INTEGRATED CIRCUIT MEMORY DEVICES THAT INCLUDE A PLURALITY OF LANDING PAD HOLES THAT ARE ARRANGED IN A STAGGERED PATTERN AND INTEGRATED CIRCUIT MEMORY DEVICES FORMED THEREBY

RELATED APPLICATION

This application claims the benefit of and priority to Korean Patent Application No. 2002-34996, filed Jun. 21, 2002, the disclosure of which is hereby incorporated herein by reference.

FIELD OF THE INVENTION

The present invention relates generally to methods of forming integrated circuit devices and integrated circuit devices formed thereby and, more particularly, to methods of forming integrated circuit memory devices and integrated circuit memory devices formed thereby.

BACKGROUND OF THE INVENTION

As integrated circuit memory devices become more highly integrated, a design rule may be reduced. The reduction in the design rule may result in the reduction of an area occupied by a unit cell. For example, in a DRAM comprising one transistor and one capacitor, the area occupied by the capacitor may be reduced. When capacitor area is reduced, the plane size of the capacitor may also be reduced, which results in a reduction in the capacitor volume.

Various approaches have been used to manufacture a capacitor having a sufficient capacitance. These approaches include increasing the height of the capacitor, reducing the thickness of the dielectric layer, and using a material having a high dielectric constant as a dielectric material. In addition, the capacitor may be formed in three-dimensions to increase the effective area of the capacitor. In particular, a cylindrical storage node may be used to increase the effective surface area by combining the inner and outer surfaces of the storage node.

FIGS. 1A and 1B illustrate an integrated circuit memory device that includes conventional cylindrical capacitors, wherein FIG. 1A is a plane view and FIG. 1B is a sectional view cut along the line I–I' of FIG. 1A. Referring now to FIGS. 1A and 1B, an interlevel insulating layer 112 having a predetermined thickness is formed on a semiconductor substrate 110 having a MOS transistor (not shown) formed therein. The interlevel insulating layer 112 may comprise silicon oxide. Storage node contact plugs 116 (hereafter referred to as "contact plugs") are formed in the interlevel insulating layer 112. The contact plugs 116 connect a source region (not shown) of the MOS transistor, which is formed under the contact plugs 116, to storage nodes 122.

The contact plugs 116 are arranged on straight horizontal and vertical lines, in a plane view. As shown in FIG. 1A, the spacing between the contact plugs 116 in a vertical direction is smaller than the spacing between the contact plugs 116 in a horizontal direction. The storage nodes 122 are also arranged on straight horizontal and vertical lines and are formed in rectangles having a relatively large difference between length and width or ovals having a relatively large difference between a major axis length and a minor axis length.

When the storage nodes 122 are formed so as to have a relatively large difference between the length and the width in the plane view, as the height of the storage nodes 122 increases, the storage nodes 122 may be susceptible to collapsing. In particular, because a ratio of the height to the width of the rectangles or a ratio of the height to the minor axis length of the ovals is relatively large, the storage nodes 122 may collapse in the width direction of the rectangles or the minor axis direction of the ovals, thereby causing defects in the devices.

Because the contact plugs 116 and the storage nodes 122 are arranged on straight vertical and horizontal lines in the plane view, and the spacing between the contact plugs 116 under the storage nodes 122 is smaller in the vertical direction than in the horizontal direction, the storage nodes 122 are formed in rectangles or ovals in the plane view. In other words, to increase the effective area of the storage nodes 122 while maintaining an electrical connection between the storage nodes 122 and the contact plugs 116, the storage nodes 122 are formed in rectangles having a relatively small width or ovals having a relatively small minor axis length in the plane view.

For example, a cylindrical storage node formed in a rectangle or an oval on a plane view in a DRAM device with a design rule of about 0.10 $\mu$m will now be described. The length of the rectangle or the major axis length of the oval is about 300 nm, the width of the rectangle or the minor axis length of the oval is about 120 nm, and the height of the storage node is about 1,500 nm. A ratio of the height to the length of the storage node is about 5 and a ratio of the height to the width of the storage node is greater than 12. Because the height of the storage node is relatively large compared with the width of the storage node, the storage node is generally more likely to collapse in the width direction than in the length direction. In addition, the distance between the storage nodes in the width direction is relatively small, about 80 nm, so that the storage nodes may electrically connect, which may cause defects in the memory device even when the storage nodes incline only a few degrees.

Other approaches, such as using a dielectric material having a high dielectric constant, may be used to increase the capacitance of a capacitor. For example, a material having a high conductive constant, such as a tantalum oxide layer ($Ta_2O_5$) or BST ($BaSrTiO_3$), may be used instead of silicon nitride as the dielectric material of the capacitor.

When using $Ta_2O_5$ or $BaSrTiO_3$, a capacitor having a relatively large capacitance can be formed; however, these materials react with polysilicon. Accordingly, if a capacitor electrode comprises polysilicon, then the electrical characteristics of the capacitor may deteriorate. This problem has resulted in studies directed to the efficacy of substituting another material, such as a metal, for polysilicon as an electrode material.

When a capacitor electrode is formed of a metal, however, processes of forming the capacitor electrode in a cell array region and forming a resistor in a core/peripheral region generally cannot be performed at the same time. The processes typically cannot be simultaneously performed because a resistance value required in the device cannot be obtained using a metal, which has a low resistance value. It is therefore generally preferable that the resistor in the core/peripheral region be formed using polysilicon, which has a relatively high resistance value. The resistance value may be relatively easily controlled by controlling the amount of implanted ion. In addition, to simplify the manufacturing processes and reduce the manufacturing cost, it is preferable that the process of forming the resistor in the core/peripheral region and forming the capacitor electrodes on the cell array region be performed at the same time.

SUMMARY OF THE INVENTION

According to some embodiments of the present invention, an integrated circuit memory device is formed by forming an interlevel insulating layer on a substrate. A plurality of storage node contact holes are formed in the interlayer insulating layer and are arranged in a pattern. A plurality of contact plugs are formed in the plurality of storage node contact holes, respectively. A material layer is formed on the interlevel insulating layer that has a plurality of landing pad holes that expose the plurality of contact plugs, respectively, the plurality of landing pad holes are arranged in a pattern that is offset with respect to the pattern of the storage node contact holes. A plurality of landing pads are formed in the plurality of landing pad holes and are connected to the plurality of contact plugs, respectively. A plurality of storage nodes are formed that are connected to the plurality of landing pads, respectively.

In other embodiments, the material layer and the plurality of landing pads are formed by depositing a conductive layer on the interlevel insulating layer and the plurality of contact plugs. The conductive layer is etched to form the plurality of landing pads. The material layer is deposited on the interlevel insulating layer and the landing pads. The material layer is planarized until the landing pads are exposed.

In still other embodiments, depositing the conductive layer comprises depositing the conductive layer on the interlevel insulating layer and in the plurality of storage node contact holes so as to form the plurality of contact plugs.

In further embodiments, the plurality of landing pad holes pattern is a zigzag pattern.

In still further embodiments, respective ones of the plurality of storage nodes have a cylindrical shape.

In still further embodiments, respective ones of the plurality of storage nodes have at least one of an equilateral polygon, regular hexagon, regular octagon, circle, rectangle, and oval shape.

In other embodiments, forming the material layer and forming the plurality of landing pads comprises depositing the material layer on the interlevel insulating layer and the plurality of contact plugs. The material layer is etched to form the plurality of landing pad holes that expose the plurality of contact plugs. A conductive layer is deposited in the plurality of landing pad holes and on the material layer. The conductive layer is planarized until the material layer is exposed so as to form the plurality of landing pads.

Although described above primarily with respect to method embodiments of the present invention, it will be understood that the present invention may also be embodied as integrated circuit memory devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1A:
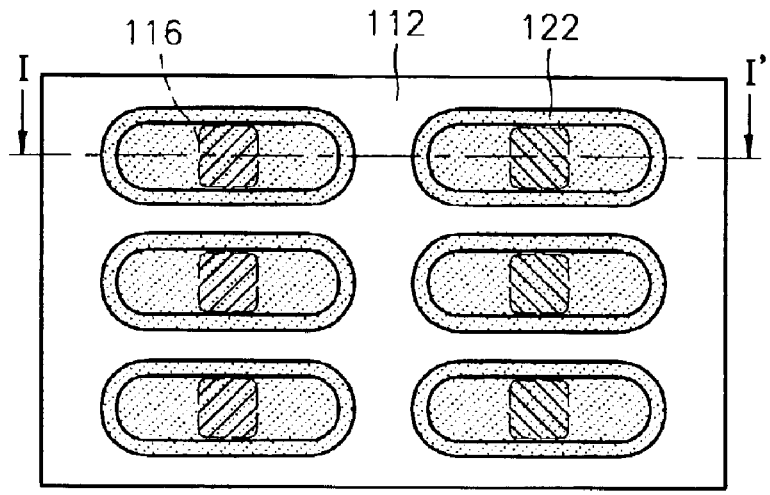
FIGS. 1A and 1B illustrate an integrated circuit memory device that includes conventional cylindrical capacitors.
Figure 1B:
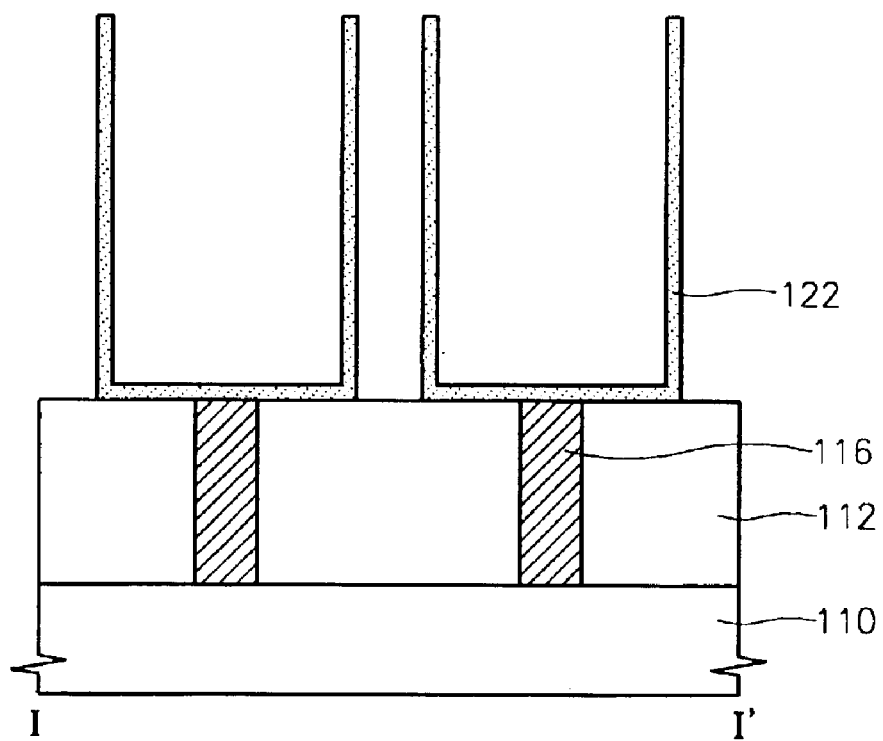

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 2A:
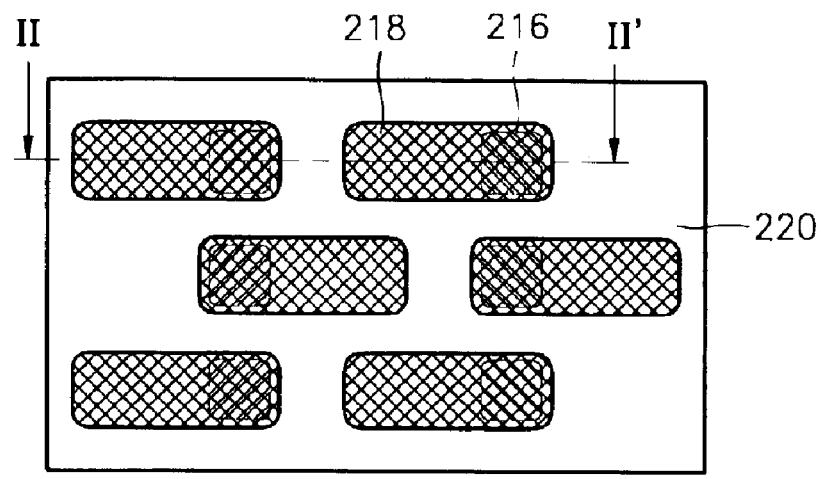
FIGS. 2A–10 illustrate integrated circuit memory devices and methods of forming the same in accordance with various embodiments of the present invention.
Figure 2B:
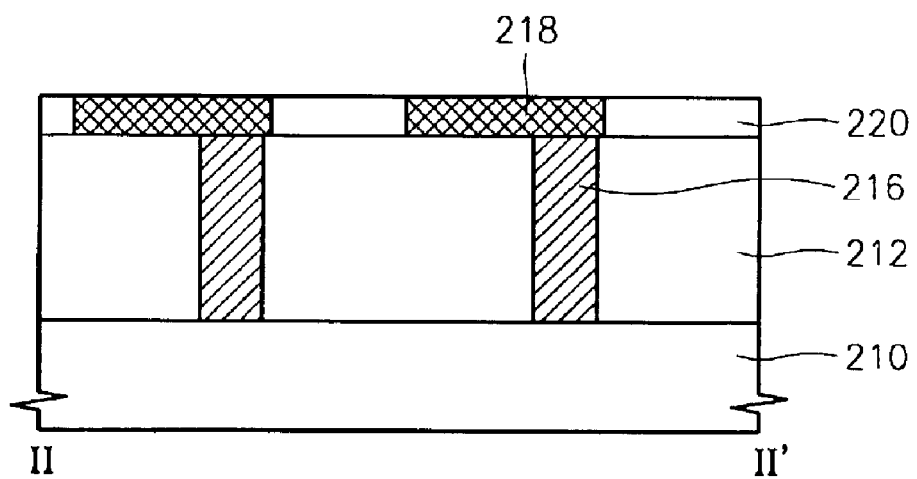

FIGS. 2A and 2B illustrate are a schematic view and a sectional view, respectively, that illustrate an integrated circuit memory device, in accordance with some embodiments of the present invention. The integrated circuit memory device comprises a semiconductor substrate 210 having a MOS transistor (not shown) formed therein. An interlevel insulating layer 212 is formed on the semiconductor substrate 210, and contact plugs 216 are formed in the interlevel insulating layer 212. The contact plugs 216 are formed on straight vertical and horizontal lines in a plane view. According to some embodiments of the present invention, the landing pads 218 are formed on the contact plugs 216 and the interlevel insulating layer 212. The landing pads 218 may be formed using a conductive material, for example, polysilicon. In other embodiments, the landing pads 218 may be formed using a metal. The landing pads 218 connect to the contact plugs 216, and, in some embodiments, the landing pads 218 may completely cover the upper surfaces of the contact plugs 216.

In addition, the areas of the landing pads 218 are generally larger than the areas of the contact plugs 216. The landing pads 218 can be formed in any shape in the plane view; however, in some embodiments, the length of the landing pads 218 in a direction in which the gap between the contact plugs 216 is the largest, i.e., a horizontal direction in FIG. 2A, is longer than the length in the other direction. In some embodiments, the landing pads 218 have a rectangular shape. The thickness of the landing pads 218 may be relatively small.

The integrated circuit memory device according to embodiments of the present invention, further comprises a material layer 220, which encompasses the landing pads 218. The material layer 220, which is formed to planarize the layer having the landing pads 218, may completely encompass the landing pads 218. The material layer 220 may be formed using an insulating material, such as a silicon oxide layer (PETEOS and/or HDP).

Because the areas of the landing pads 218 are larger than the areas of the contact plugs 216, the landing pads 218 can be arranged in the plane view in a different manner than the contact plugs 216, which are arranged on straight vertical and horizontal lines in the plane view. Thus, the landing pads 218 can be arranged in a zigzag (staggered) pattern in the plane view as shown in FIG. 2A.

Figure 3A:
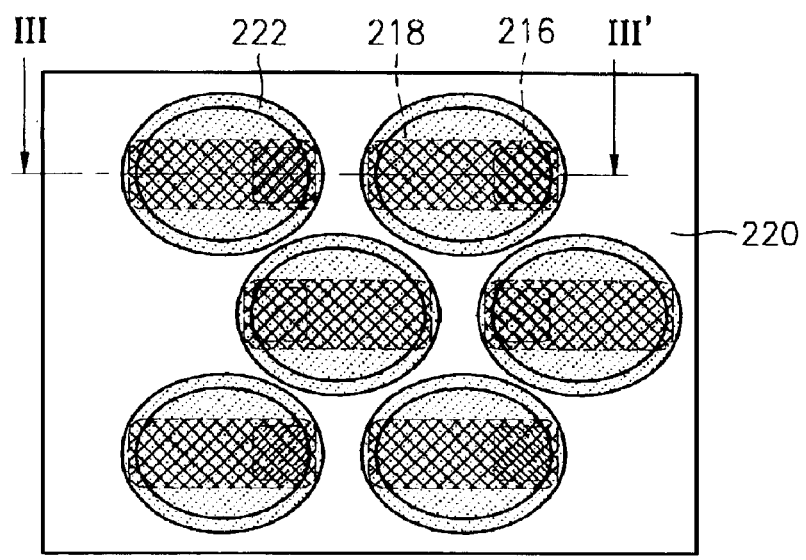
Figure 3B:
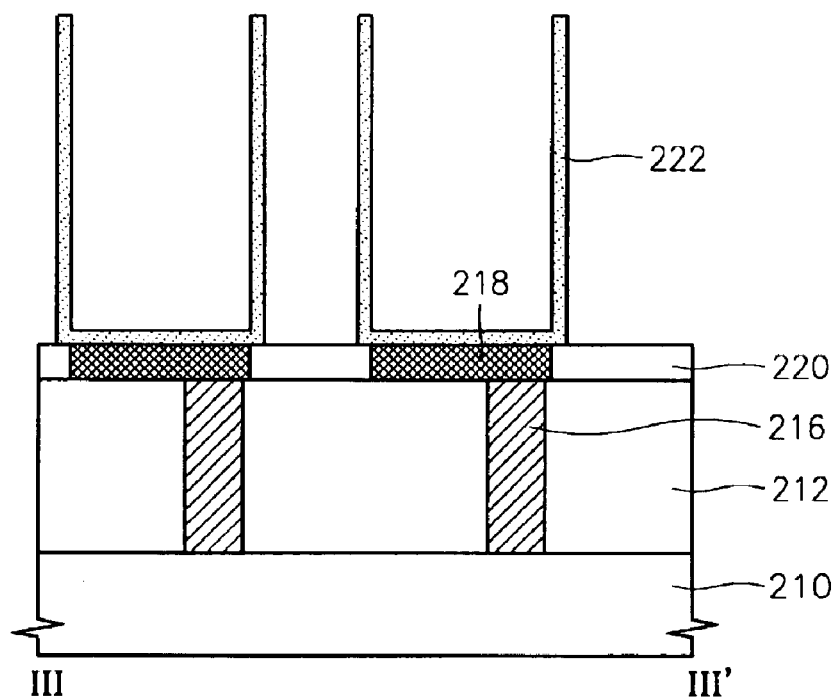

Referring to FIGS. 3A and 3B, the integrated circuit memory device further comprises storage nodes 222, which may be lower electrodes of capacitors. The storage nodes 222 electrically connect to the contact plugs 216 via the landing pads 218. In addition, the storage nodes 222 are arranged in a zigzag pattern in the plane view like the landing pads 218. Because the storage nodes 222 may be arranged in a zigzag pattern in the plane view, the storage nodes 222 may be formed in shapes other than a rectangle having a relatively large difference between a length and a width or an oval having a relatively large difference between a major axis length and a minor axis length. In some embodiments of the present invention, the gaps between the contact plugs 216 in a vertical direction are much different from the gaps in a horizontal direction; however, in other embodiments, the gaps between the landing pads 218 in a vertical direction are almost the same as those in a horizontal direction. Accordingly, the storage nodes 222 may be formed in shapes other than a rectangle or an oval.

Thus, according to some embodiments of the present invention, the storage nodes 222 may be formed in such shapes as an equilateral polygon, such as a square, a regular hexagon, a regular octagon, a circle, a rectangle, a rhombus having a relatively small difference between a length and a width, and/or an oval having a relatively small difference between a major axis length and a minor axis length. In FIG. 3A, the storage nodes 222 are formed in circles in the plane view. Advantageously, because a ratio of the height to the smallest length of the storage nodes 222 is generally smaller than the ratio in conventional storage nodes, the storage nodes 222 may be less likely to collapse.

For example, assume that the cylindrical storage nodes, which are formed as rectangles or ovals in the plane view, are formed in a DRAM device having a design rule of 0.10 μm. According to some embodiments of the present invention, the length of the rectangle or the major axis length of the oval is about 250 nm, the width of the rectangle or the minor axis length of the oval is about 200 nm, and the height is about 1,500 nm for the respective storage nodes 222. Accordingly, a ratio of the height to the length of the storage nodes is about 5 and a ratio of the height to the width of the storage nodes is about 8. Because the ratio of the height to the width is typically smaller than the ratio of the height to the width in conventional storage nodes by about two thirds, the storage nodes 222 are less likely to collapse resulting in fewer defects in the memory device.

Because the lengths of the storage nodes 222 are generally less than that of conventional storage nodes, the effective areas of the storage nodes 222 may be reduced by about 10% from that of conventional storage nodes. To avoid reducing the effective areas of the storage nodes 222, the heights of the storage nodes 222 may be increased without subjecting the storage nodes 222 to an increased risk of collapsing.

If the storage nodes 222 are formed so that the ratio of the height to the width or the minor axis length is the same as that of conventional storage nodes, then the height of the storage nodes can be increased by about 30%. This may increase the effective area of the capacitor by about 20% so that the capacitance of the capacitor may increase by about 20%.

FIGS. 4 through 7 are schematic sectional views that illustrate integrated circuit memory devices and methods of forming the same according to some embodiments of the present invention.

Figure 4:
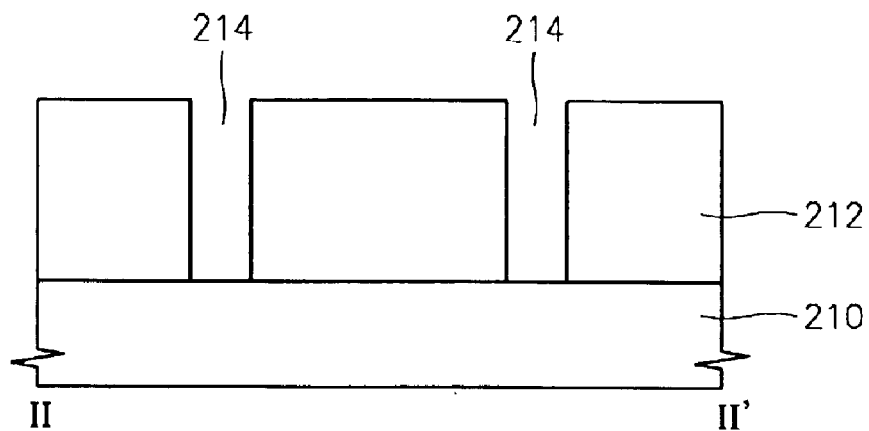

Referring now to FIG. 4, an interlevel insulating layer 212 is formed on a semiconductor substrate 210 having a MOS transistor (not shown) formed therein. The interlevel insulating layer 212 may comprise a silicon oxide layer, such as HDP and/or BPSG, and may have a thickness of about 2,000 Å. After the interlevel insulating layer 212 is exposed and developed, portions of the interlevel insulating layer 212 are etched to form contact holes 214. As shown in FIG. 4, the contact holes 214 are arranged on straight vertical and horizontal lines, because source regions (not shown), which will be connected to storage nodes, are arranged on straight lines in the semiconductor substrate 210.

Figure 5:
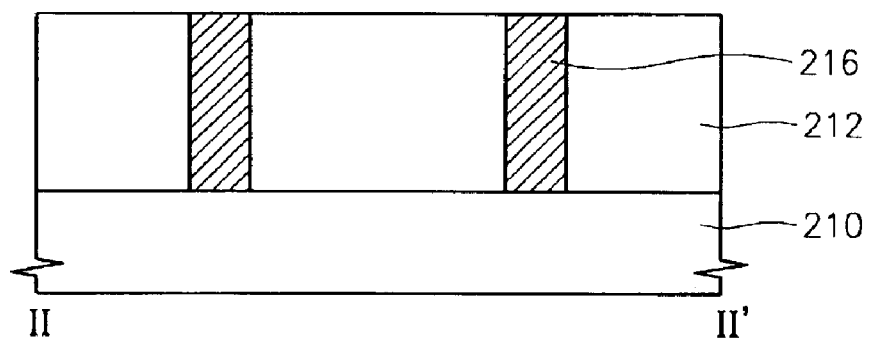

Referring now to FIG. 5, a conductive material is deposited in the contact holes 214 and on the interlevel insulating layer 212. In accordance with some embodiments of the invention, the conductive material may comprise polysilicon. In other embodiments of the present invention, the conductive material may comprise a metal. Thereafter, a dry etchback a nd/or a chemical mechanical polishing (CMP) process is performed on the deposited conductive material to planarize the conductive material until the interlevel insulating layer 212 is exposed. As a result, the conductive material on the interlevel insulating layer 212 is removed and contact plugs 216 are formed. Because the contact plugs 216 fill in the contact holes 214, the contact plugs 216 are arranged on straight vertical and horizontal lines in the plane view, as shown in FIG. 2A.

Figure 6:
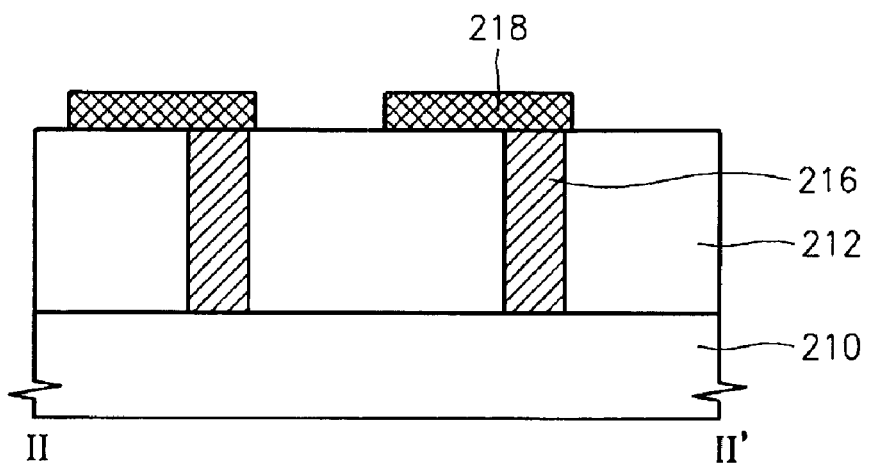

Referring now to FIG. 6, a conductive layer is blanket deposited on the contact plugs 216 and the interlevel insulating layer 212 to a thickness of about 1,000 Å and patterned to form landing pads 218. In accordance with some embodiments of the invention, the conductive layer may comprise polysilicon. In other embodiments of the present invention, the conductive layer may comprise a metal. The conductive layer is etched using a photoresist as a mask having a predetermined pattern so that the landing patterns 218 are formed. The conductive layer may be dry etched in accordance with some embodiments of the present invention.

Unlike the arrangement of the contact plugs 216, the landing pads 218 can be more freely patterned. In other words, as long as the landing pads 218 electrically connect to the contact plugs 216, the landing pads 218 can be arranged in a zigzag pattern, as shown in FIG. 2A, for example, instead of on straight vertical and horizontal lines. The landing pads 218 may completely cover the exposed surfaces of the contact plugs 216 to secure the electrical connection between the contact plugs 216 and the landing pads 218. In addition, when the landing pads 218 completely cover the exposed surfaces of the contact plugs 216, the contact plugs 216 may be protected from etch damage when etching the landing pads 218.

Figure 7:
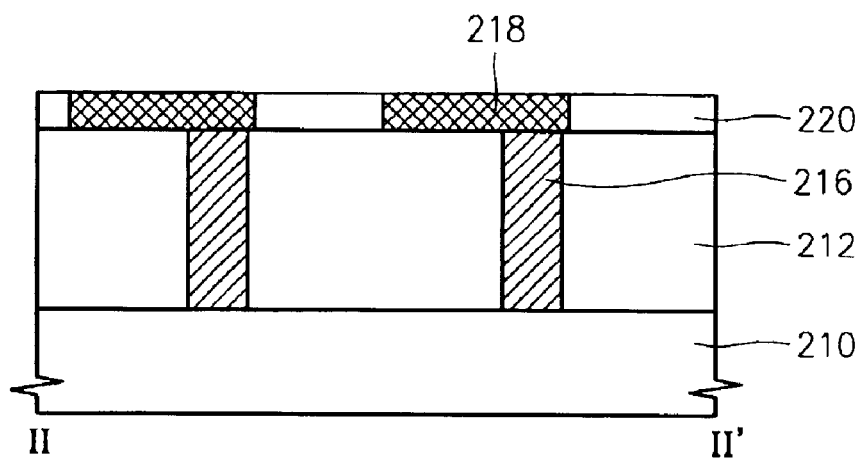

Referring now to FIG. 7, a material layer 220 is deposited on the interlevel insulating layer 212 and the landing pads 218. The material layer 220 may comprise a silicon oxide layer, such as PETEOS or HDP. Thereafter, the material layer 220 is planarized, using, for example, CMP, until the landing pads 218 are exposed.

Thereafter, formation of the capacitors may be completed using generally conventional techniques. For example, an etch stop layer and a mold oxide layer may be successively deposited. A material having a generally good etching selectivity with respect to the silicon oxide layer may be used as the etch stop layer. For example, the etch stop layer may comprise a silicon nitride layer, which is formed to a thickness of about 500 to 1,000 Å. The mold oxide layer may comprise PETEOS and maybe formed to a thickness of about 15,000 Å.

The mold oxide layer and the etch stop layer may be selectively removed using a photolithographic process and an etch process to define a region where storage nodes will be formed. Accordingly, the landing pads 218 are exposed. The mold oxide layer may be formed in a zigzag pattern in the plane view corresponding to the arrangement of the landing pads 218 to form the storage nodes.

A conductive material used to form the storage nodes is blanket deposited on the resulting structure. The storage nodes may comprise polysilicon and/or a metal. If the storage nodes comprise polysilicon, then the polysilicon is deposited to a thickness of about 400 to 500 Å. Thereafter, an oxide layer, which serves as a buffer insulating layer, is deposited to a thickness of about 3,000 to 6,000 Å, and the buffer insulating layer and the conductive material are etched using, for example, CMP, so that nodes are separated. The remaining buffer insulating layer and mold oxide layer are removed using a wet etch process to complete the cylindrical storage nodes 222 as shown in FIG. 3B.

In accordance with further embodiments of the present invention, the contact plugs 216 and the landing pads 218 may be formed using the same material. As described above, because the contact plugs 216 and the landing pads 218 are formed using a conductive material to electrically connect storage nodes 222 to source regions of the semiconductor substrate 210, it is possible to form the contact plugs 216 and the landing pads 218 using the same material.

Returning to FIG. 4, a conductive material for the contact plugs 216 and the landing pads 218 is deposited. The conductive layer may be formed on the interlevel insulating layer 212 to a thickness of larger than a desired thickness. Thus, the conductive layer may be planarized after it is deposited. The subsequent processes of etching the conductive layer to form the landing pads 218, depositing a material layer 220, and forming the storage nodes 222 are the same as described above. Advantageously, by forming the landing pads 218 using the same material as is used to form the contact plugs 216, manufacture of integrated circuit devices may be simplified.

Figure 8:
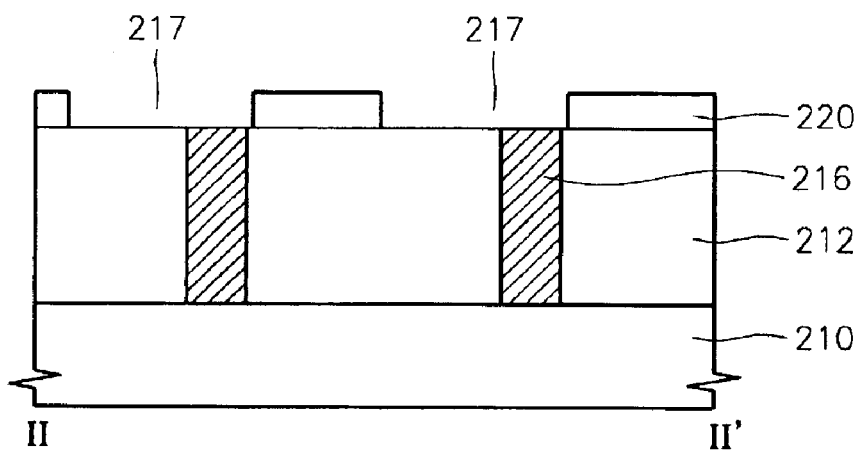
Figure 9:
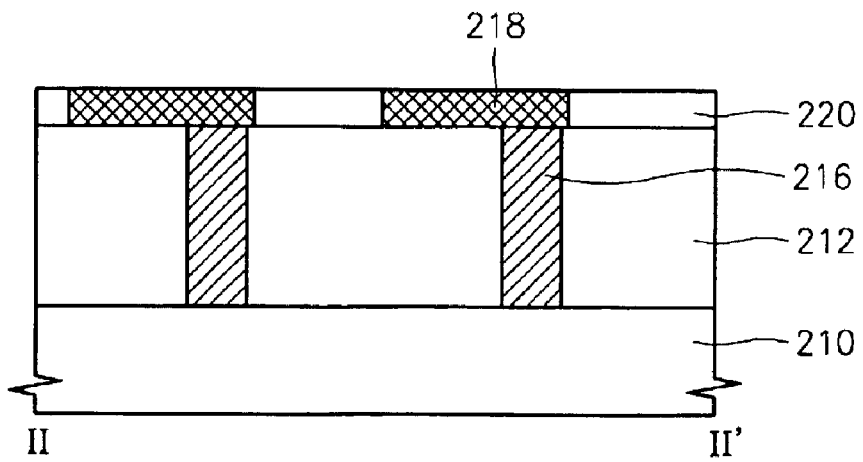

FIGS. 8 and 9 are schematic sectional views that illustrate integrated circuit memory devices and methods of forming the same according to further embodiments of the present invention. Referring now to FIG. 8, the integrated circuit memory device is formed as described above with reference to FIGS. 4 and 5. Unlike FIG. 6, however, a material layer 220 is deposited on an interlevel insulating layer 212 and contact plugs 216 to a thickness of about 1,000 to 2,000 Å. The material layer 220 may comprise, for example, a silicon oxide layer, such as PETEOS and/or HDP. Thereafter, the material layer may be planarized using a CMP process, and portions of the material layer 220 are selectively removed using a photolithographic process and/or an etch process to form landing pad holes 217.

The pattern for the landing pad holes 217 is determined based on the intended arrangement of the landing pads 218, which will be formed subsequently. The landing pad holes 217 expose the contact plugs 216 to secure an electrical connection between the landing pads 218 and the contact plugs 216. In addition, the landing pad holes 217 may be arranged in a zigzag pattern in the plane view.

Referring to FIG. 9, a conductive material is deposited in the landing pad holes 217 and on the material layer 220 to a thickness of about 2,000 Å. Because the conductive material is used to form the landing pads 218, the conductive material may comprise polysilicon. In other embodiments, however, a conductive material, such as metal can be used. The deposited conductive material is etched using a dry etch process and/or a CMP process until the material layer 220 is exposed so as to form the landing pads 218. Thereafter, storage nodes 222 are formed as described above with respect to FIGS. 3A and 3B.

Figure 10:
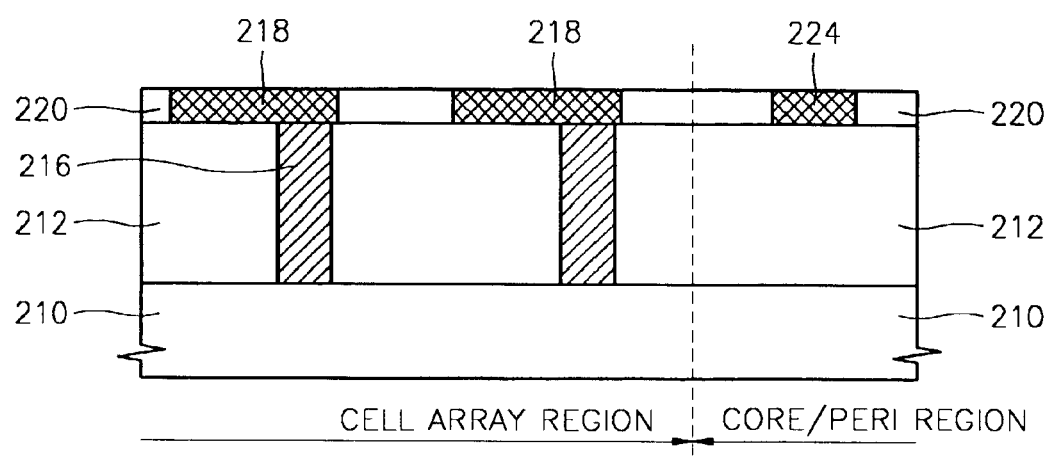

In accordance with further embodiments of the present invention, a resistor may be formed in a core/peripheral region. As described above, a resistor formed in a core/peripheral region is traditionally formed using polysilicon, which has a high resistance value. Referring now to FIG. 10, a resistor 224 is formed in a core/peripheral region on which a material layer pattern 220 is formed. The resistor 224 may be formed in a similar manner to the formation of the landing pads 218 described above. Formation of the resistor 224 will now be described in detail.

When depositing a conductive layer to form the landing pads 218 on a cell array region, a conductive layer is deposited on the core/peripheral region to form the resistor 224. The conductive layer may comprise, for example, polysilicon. When forming the landing pads 218 in the cell array region by etching the conductive layer, a resistor 224 is formed in the core/peripheral region. Thereafter, the material layer 220 is deposited and planarized to form the integrated circuit memory device of FIG. 10.

In accordance with some other embodiments of the present invention, when depositing a conductive layer for forming the landing pads 218 while forming the contact plugs 216 on the cell array region, a conductive layer can be simultaneously deposited on the core/peripheral region to form the resistor 224. The conductive layer may comprise polysilicon.

In accordance with further embodiments of the present invention, when depositing the material layer 220 on the interlevel insulating layer 212 and in the contact plugs 216 of the cell array region, the material layer 220 is simultaneously deposited on the core/peripheral region. Thereafter, when etching the material layer 220 to form landing pad holes on the cell array region, the material layer 220 on the core/peripheral region is simultaneously etched to define a resistor region. After the conductive material is deposited in the landing pad holes, the resistor region, and on the material layer 220, the conductive material is planarized until the material layer 220 is exposed, thereby completing the formation of the landing pads 218 and the resistor 224.

Thus, according to some embodiments of the present invention, the resistor 224 can be formed in the core/peripheral region while forming the landing pads 218 in the cell array region. Thus, even when the capacitor electrodes are formed using a metal, the resistor 224 can be formed using polysilicon. Furthermore, fabrication processing can be simplified by not requiring separate steps/procedures for forming the resistor 224.

As described above, according to some embodiments of the present invention, storage nodes can be freely arranged in the plane view by forming the landing pads between the contact plugs and the storage nodes. Even when the contact plugs are arranged on straight vertical and horizontal lines in the plane view, the storage nodes can be arranged in a zigzag pattern in the plane view. Accordingly, the storage nodes can be formed in the shape of polygons and/or circles in the plane view. Moreover, because the ratio of the height to the width is typically smaller than the ratio of the height to the width in conventional storage nodes, the storage nodes are less likely to collapse resulting in fewer defects in the memory device.

In addition, when forming landing pads using polysilicon, a resistor can be formed in the core/peripheral region. This may allow for more simplified fabrication processing as separate processes for forming the resistor in the core/peripheral region are unnecessary.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. An integrated circuit memory device, comprising:
   a substrate;
   an interlevel insulating layer disposed on the substrate and having a plurality of storage node contact holes formed therein arranged in a pattern;
   a plurality of contact plugs disposed in the plurality of storage node contact holes, respectively;
   a material layer disposed on the interlevel insulating layer and having a plurality of landing pad holes formed therein that expose the plurality of contact plugs, respectively, the plurality of landing pad holes being arranged in a pattern that is offset with respect to the pattern of the storage node contact holes;
   a plurality of landing pads disposed in the plurality of landing pad holes that are connected to the plurality of contact plugs, respectively; and
   a plurality of storage nodes that are connected to the plurality of landing pads, respectively.

2. The integrated circuit memory device of claim 1, wherein the plurality of landing pad holes pattern is a zigzag pattern.

3. The integrated circuit memory device of claim 1, wherein respective ones of the plurality of storage nodes have a cylindrical shape.

4. The integrated circuit memory device of claim 1, wherein respective ones of the plurality of storage nodes have at least one of a equilateral polygon, regular hexagon, regular octagon, circle, rectangle, and oval shape.

5. A method of forming an integrated circuit memory device, comprising:
   forming an interlevel insulating layer on a substrate;
   forming a plurality of storage node contact holes in the interlayer insulating layer that are arranged in a pattern;
   forming a plurality of contact plugs in the plurality of storage node contact holes, respectively;
   forming a material layer on the interlevel insulating layer that has a plurality of landing pad holes that expose the plurality of contact plugs, respectively, the plurality of landing pad holes being arranged in a pattern that is offset with respect to the pattern of the storage node contact holes;
   forming a plurality of landing pads in the plurality of landing pad holes that are connected to the plurality of contact plugs, respectively; and
   forming a plurality of storage nodes that are connected to the plurality of landing pads, respectively.

6. The method of claim 5, wherein forming the material layer and forming the plurality of landing pads comprises:
   depositing a conductive layer on the interlevel insulating layer and the plurality of contact plugs;
   etching the conductive layer to form the plurality of landing pads;
   depositing the material layer on the interlevel insulating layer and the landing pads; and
   planarizing the material layer until the landing pads are exposed.

7. The method of claim 6, wherein depositing the conductive layer comprises:
   depositing the conductive layer on the interlevel insulating layer and in the plurality of storage node contact holes so as to form the plurality of contact plugs.

8. The method of claim 6, wherein the plurality of landing pad holes pattern is a zigzag pattern.

9. The method of claim 6, wherein respective ones of the plurality of storage nodes have a cylindrical shape.

10. The method of claim 6, wherein respective ones of the plurality of storage nodes have at least one of an equilateral polygon, regular hexagon, regular octagon, circle, rectangle, and oval shape.

11. The method of claim 5, wherein forming the material layer and forming the plurality of landing pads comprises:
    depositing the material layer on the interlevel insulating layer and the plurality of contact plugs;
    etching the material layer to form the plurality of landing pad holes that expose the plurality of contact plugs;
    depositing a conductive layer in the plurality of landing pad holes and on the material layer; and
    planarizing the conductive layer until the material layer is exposed so as to form the plurality of landing pads.

12. The method of claim 11, wherein the plurality of landing pad holes pattern is a zigzag pattern.

13. The method of claim 11, wherein respective ones of the plurality of storage nodes have a cylindrical shape.

14. The method of claim 11, wherein respective ones of the plurality of storage nodes have at least one of an equilateral polygon, regular hexagon, regular octagon, circle, rectangle, and oval shape.

15. A method of forming an integrated circuit memory device, comprising:
    forming an interlevel insulating layer on a substrate that has a cell array region and a core/peripheral region;
    forming a plurality of storage node contact holes in the interlayer insulating layer on the cell array region that are arranged in a pattern;
    forming a plurality of contact plugs in the plurality of storage node contact holes, respectively;
    forming a material layer on the interlevel insulating layer that has a plurality of landing pad holes that expose the plurality of contact plugs, respectively, the plurality of landing pad holes being arranged in a pattern that is offset with respect to the pattern of the storage node contact holes and has a resistor hole on the core/peripheral region;
    forming a plurality of landing pads in the plurality of landing pad holes that are connected to the plurality of contact plugs, respectively and a resistor in the resistor hole simultaneously; and
    forming a plurality of storage nodes that are connected to the plurality of landing pads, respectively.

16. The method of claim 15, wherein forming the material layer and forming the plurality of landing pads comprises:
    depositing a conductive layer on the interlevel insulating layer and the plurality of contact plugs;
    etching the conductive layer to form the plurality of landing pads and the resistor;
    depositing the material layer on the interlevel insulating layer, the landing pads, and the resistor; and
    planarizing the material layer until the landing pads and resistor are exposed.

17. The method of claim 16, wherein depositing the conductive layer comprises:
    depositing the conductive layer on the interlevel insulating layer and in the plurality of storage node contact holes so as to form the plurality of contact plugs.

18. The method of claim 16, wherein the the plurality of landing pad holes pattern is a zigzag pattern.

19. The method of claim 16, wherein respective ones of the plurality of storage nodes have a cylindrical shape.

20. The method of claim 16, wherein respective ones of the plurality of storage nodes have at least one of an equilateral polygon, regular hexagon, regular octagon, circle, rectangle, and oval shape.

21. The method of claim 15, wherein forming the material layer and forming the plurality of landing pads comprises:

depositing the material layer on the interlevel insulating layer and the plurality of contact plugs;

etching the material layer to form the plurality of landing pad holes that expose the plurality of contact plugs and the resistor hole;

depositing a conductive layer in the plurality of landing pad holes, the resistor hole, and on the material layer; and planarizing the conductive layer until the material layer is exposed so as to form the plurality of landing pads and the resistor.

22. The method of claim 21, wherein the the plurality of landing pad holes pattern is a zigzag pattern.

23. The method of claim 21, wherein respective ones of the plurality of storage nodes have a cylindrical shape.

24. The method of claim 21, wherein respective ones of the plurality of storage nodes have at least one of an equilateral polygon, regular hexagon, regular octagon, circle, rectangle, and oval shape.

* * * * *